United States Patent
Heeney et al.

(10) Patent No.: US 7,807,776 B2
(45) Date of Patent: Oct. 5, 2010

(54) PROCEES OF PREPARING REGIOREGULAR POLYMERS

(75) Inventors: Martin Heeney, Southampton (GB);
Iain McCulloch, Southampton (GB);
Mark Giles, Southampton (GB);
Guntram Koller, Gross-Umstadt (DE);
Weimin Zhang, Southampton (GB)

(73) Assignee: Merck Patent Gesellschaft mit beschrankter Haftung, Darmstadt (DE)

( * ) Notice: Subject to any disclaimer, the term of this patent is extended or adjusted under 35 U.S.C. 154(b) by 45 days.

(21) Appl. No.: 11/816,047

(22) PCT Filed: Jan. 17, 2006

(86) PCT No.: PCT/EP2006/000360

§ 371 (c)(1),
(2), (4) Date: May 8, 2008

(87) PCT Pub. No.: WO2006/084545

PCT Pub. Date: Aug. 17, 2006

(65) Prior Publication Data

US 2009/0023887 A1   Jan. 22, 2009

(30) Foreign Application Priority Data

Feb. 11, 2005   (EP) .................. 05002918

(51) Int. Cl.
*C08G 75/00* (2006.01)
(52) U.S. Cl. ..................... 528/380; 528/377
(58) Field of Classification Search ................. 528/380
See application file for complete search history.

(56) References Cited

U.S. PATENT DOCUMENTS

| 2,959,589 | A | | 11/1960 | Hugh |
| 4,711,742 | A | | 12/1987 | Jen et al. |
| 5,247,062 | A | | 9/1993 | Sawada et al. |
| 5,391,622 | A | | 2/1995 | Ho et al. |
| 5,500,537 | A | * | 3/1996 | Tsumura et al. ............... 257/40 |
| 7,294,288 | B2 | * | 11/2007 | Koller et al. ................. 252/500 |
| 2004/0024171 | A1 | | 2/2004 | McCullough et al. |
| 2004/0178408 | A1 | * | 9/2004 | McCulloch et al. ........... 257/40 |
| 2006/0155105 | A1 | * | 7/2006 | Werner et al. ............... 528/377 |

FOREIGN PATENT DOCUMENTS

WO   WO 2005/014691 A   2/2005

OTHER PUBLICATIONS

Loewe R. S. et al. Regioregular, Head-To Tail Coupled Poly(3-Alkylthiophenes) Made Easy by the Grim Method: Investigation of the Reaction And The Origin of Regioselectivity, MacroMolecules ACS, 2001, vol. 34, No. 13, pp. 4324-4333, Washington, DC.

Huanyu Mao et al., Synthesis and Structure-Property Relationship of Regioirregular Poly(3-Hexylthiophenes), MacroMolecules ACS, Mar. 1, 1993, pp. 1163-1169, vol. 26, No. 26, Washington, DC.

D. E. Pearson et al., A Study of the Entrainment Method for Making Grignard Reagents, Journal of Organic Chemistry, 1959, pp. 504-509, vol. 24.

* cited by examiner

*Primary Examiner*—Randy Gulakowski
*Assistant Examiner*—Shane Fang
(74) *Attorney, Agent, or Firm*—Millen, White, Zelano & Branigan, P.C.

(57) ABSTRACT

The invention relates to a process of preparing regioregular polymers, in particular head-to-tail (HT) poly-(3-substituted) thiophenes with high regioregularity, to novel polymers prepared by this process, and to the use of the novel polymers as semiconductors or charge transport materials in optical, electrooptical or electronic devices including field effect transistors (FETs), electroluminescent, photovoltaic and sensor devices, to FETs and other semiconducting components or materials comprising the novel polymers.

41 Claims, No Drawings

PROCEES OF PREPARING REGIOREGULAR POLYMERS

FIELD OF INVENTION

The invention relates to a process of preparing regioregular polymers, in particular head-to-tail (HT) poly-(3-substituted) thiophenes with high regioregularity, and to novel polymers prepared by this process. The invention further relates to the use of the novel polymers as semiconductors or charge transport materials in optical, electrooptical or electronic devices including field effect transistors (FETs), electroluminescent, photovoltaic and sensor devices. The invention further relates to FETs and other semiconducting components or materials comprising the novel polymers.

BACKGROUND AND PRIOR ART

Organic materials have recently shown promise as the active layer in organic based thin film transistors and organic field effect transistors (OFETs) [see H. E. Katz, Z. Bao and S. L. Gilat, *Acc. Chem. Res.,* 2001, 34, 5, 359]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1\times10^{-3}$ $cm^2V^{-1}$ $s^{-1}$). In addition, it is important that the semiconducting material is relatively stable to oxidation i.e. it has a high ionisation potential, as oxidation leads to reduced device performance.

In prior art regioregular head-to-tail (HT) poly-(3-alkylthiophene), in particular poly-(3-hexylthiophene), has been suggested for use as semiconducting material, as it shows charge carrier mobility between $1\times10^{-5}$ and $0.1$ $cm^2$ $V^{-1}$ $s^{-1}$. Also, poly-(3-alkylthiophene) shows good solubility in organic solvents and is solution processable to fabricate large area films.

A high regioregularity of the poly-(3-alkylthiophene) is important for its electronic and photonic properties, as it leads to improved packing and optimised microstructure, leading to improved charge carrier mobility [see U.S. Pat. No. 6,166,172, H. Sirringhaus et al., *Science*, 1998, 280, 1741-1744; H. Sirringhaus et al., *Nature,* 1999, 401, 685-688; and H. Sirringhaus, et al., *Synthetic Metals,* 2000, 111-112, 129-132]. The regioregularity is strongly influenced by the method of preparing the polymer.

Several methods to produce highly regioregular HT-poly-(3-alkylthiophene) have been reported in prior art, for example in the review of R. D. McCullough, *Adv. Mater.,* 1998, 10(2), 93-116 and the references cited therein.

Known methods to prepare HT-poly(3-alkylthiophene) with a regioregularity ≧90% starting from 2,5, dibromo-3-alkylthiophene include for example the "Rieke method", by reacting the educt (wherein R is alkyl) with highly reactive zinc in THF as illustrated below.

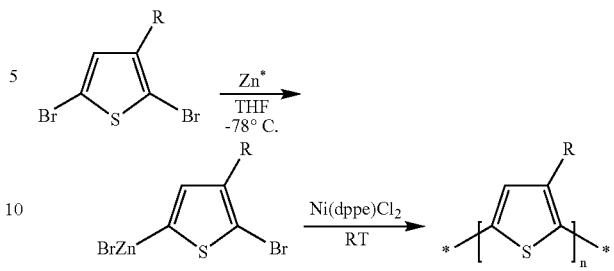

Also known is the method described in McCullough et al., *Adv. Mater.,* 1999, 11(3), 250-253 and in EP 1 028 136 and U.S. Pat. No. 6,166,172, the entire disclosure of these documents being incorporated into this application by reference. According to this route the educt is reacted with methylmagnesium bromide in THF as shown below.

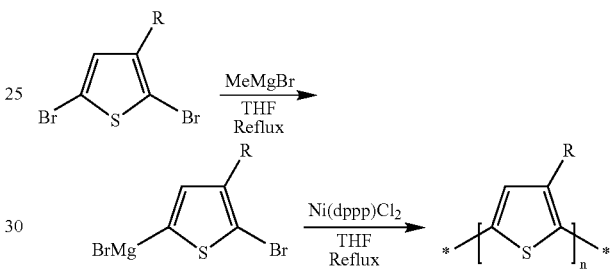

It was also reported to prepare regioregular poly(3-alkylthiophene) by the "Stille-method" (see Stille, Iraqi, Barker et al., *J. Mater. Chem.,* 1998, 8, 25) as illustrated below

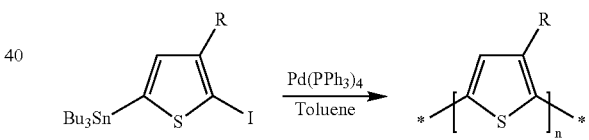

or by the "Suzuki-method" (see Suzuki, Guillerez, Bidan et al., *Synth. Met.,* 1998, 93, 123) as shown below.

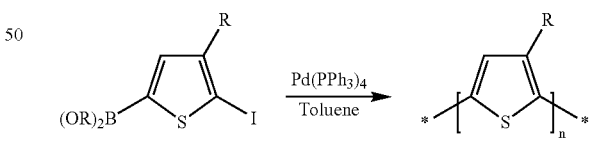

However, the methods described in prior art have several drawbacks. Thus, for example the Rieke method requires the costly and difficult preparation of the highly active "Rieke zinc". The Stille and Suzuki methods require an extra processing step which reduces the process efficiency. The McCullough method requires the costly Grignard reagent methylmagnesium bromide. Additionally, it produces methyl bromide as a by-product in stoichiometrical quantities which especially in large scale production causes environmental problems. As methyl bromide cannot be eliminated from the exhaust gases with a gas washer, costly techniques and means for exhaust air combustion are needed.

Prior art also reports the preparation of unsubstituted polythiophene by Nickel-catalysed coupling of a Grignard reagent that is formed from the reaction of a 2,5-dihalogenated thiophene with magnesium.

This route was first reported in 1984 (J. P. Montheard; T. Pascal, *Synth. Met,* 1984, 9, 389 and M. Kobayashi; J. Chen; T.-C. Chung; F. Moraes; A. J. Heeger; F. Wudl, *Synth. Met,* 1984, 9, 77). However, this method yielded only low molecular weights. Also these polymers only have low solubility, compared to 3-alkyl substituted polythiophenes.

There are also reports on the preparation of poly (3-alkyl thiophene) using the Nickel-catalysed coupling of a Grignard reagent formed from 2,5-dihalogenated 3-alkylthiophene with magnesium as illustrated below.

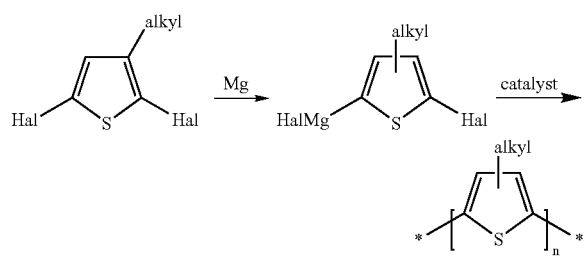

T. Yamamoto; K.-I. Sanechika; A. Yamamoto, *Bull. Chem. Soc. Jpn.,* 1983, 56, 1497 and U.S. Pat. No. 4,521,589 describe the Grignard coupling of 2,5-dihalo-3-alkylthiophene in THF, wherein the alkyl group is lower alkyl with 1 to 4 C-atoms, like methyl. However, the resulting polymers are reported to have low molecular weight (1,370 or 2,300) and low regioregularity (as can be seen from the $^1$H—NMR spectra). U.S. Pat. No. 4,521,589 also mentions a higher weight fraction with a degree of polymerization of 96 as concluded from IR spectra, but no molecular weight measurement data are given. A series of publications by Elsenbaumer et al. also describes the synthesis of poly (3-alkyl thiophenes) by Grignard coupling (R. L. Elsenbaumer; K. Y. Jen; R. Oboodi, *Synth. Met,* 1986, 15, 169; furthermore K. Y. Jen; R. Oboodi; R. L. Elsenbaumer, *Polym. Mater. Sci. Eng.,* 1985, 53, 79 and K.-Y. Jen; G. G. Miller; R. L. Elsenbaumer, *J Chem Soc, Chem Commun,* 1986, 1346). However, these polymers mostly have molecular weights ($M_n$) in the range of 3,000 to 8,000, with the exception of a homopolymer obtained from 2,5-diiodo-3,4-dimethylthiophene and a copolymer obtained from 2,5-diiodo-3-methyl-and 2,5-diiodo-3-n-butylthiophene, which are reported to have a molecular weight of 26,000 and 35,000 respectively. U.S. Pat. No. 4,711,742 (Elsenbaumer et al.) reports the synthesis of poly(3-butylthiophene) by Grignard coupling of the diiodo monomer in 2-methyl-tetrahydrofuran, giving a molecular weight of 41,400 corresponding to a degree of polymerization of 300. However, the poly (3-alkyl thiophenes) described in the above documents are regiorandom with relatively low amounts of the desired head-to-tail head-to-tail (HT-HT) triads (see e.g. K.-Y. Jen; G. G. Miller; R. L. Elsenbaumer, *J Chem Soc, Chem Commun,* 1986,1346).

In a study of poly (3-decyl thiophene) made by three different routes (see P. C. Stein; C. Botta; A. Bolognesi; M. Catellani, *Synth. Met,* 1995, 69, 305) a sample prepared using the Grignard polymerisation of the diiodo monomer was found to have a regioregularity of 70% by $^1$H—NMR. A study of the synthesis of poly (3-hexyl thiophene) using the Grignard reaction of 2,5-diiodo-3-hexylthiophene with magnesium in ether (see H. Mao; S. Holdcroft, *Macromolecules,* 1992, 25, 554) resulted in a molecular weight ($M_n$) of 5,200. No direct regioregularity data are given but the $^1$H—NMR shows peaks from all four possible triads, suggesting relatively low regioregularity. Another study of the same authors (see H. Mao; S. Holdcroft, *Macromolecules,* 1993, 26, 1163) reported only poly (3-hexyl thiophenes) with low regioregularities (up to 58% HT-HT triads or up to 80% HT dyads).

In conclusion, although the preparation of poly (3-alkyl thiophenes) by Grignard reaction with magnesium has been described in the literature, the polymers synthesised are reported to have low molecular weight and/or low or random regioregularity.

Therefore, there is still a need for an improved method of preparing polymers, in particular poly-(3-substituted) thiophenes with high regioregularity, high molecular weight, high purity and high yields in an economical, effective and environmentally beneficial way, which is especially suitable for industrial large scale production.

It was an aim of the present invention to provide an improved process for preparing polymers with these advantages, but not having the drawbacks of prior art methods mentioned above.

Other aims of the present invention are immediately evident to the person skilled in the art from the following detailed description.

The inventors of the present invention have found that these aims can be achieved, and the above problems be solved, by providing a process of preparing polymers, in particular poly-(3-substituted) thiophenes according to the present invention as described below. According to this process, a 3-substituted thiophene monomer with at least two groups, wherein these groups are leaving groups that are capable of reacting with magnesium, is reacted with magnesium in the presence of a catalytic amount of an organohalide or organomagnesium halide in a suitable solvent to form an intermediate, which is then polymerized in the presence of a suitable catalyst. It was surprisingly found that, by using this method it is possible to obtain polymers, in particular poly-(3-substituted) thiophenes, with high regioregularity, high molecular weight and high purity in good yields and avoiding large amounts of hazardous by-products that need to be eliminated.

The polymers prepared by the process according to the present invention are especially useful as charge transport materials for semiconductor or light-emitting materials, components or devices.

SUMMARY OF THE INVENTION

The invention relates to a process of preparing a polymer from an optionally substituted thiophene having at least two groups that are capable of reacting with magnesium, by reacting said thiophene with magnesium in the presence of a catalytic amount of an organohalide or organomagnesium halide to form a regiochemical Grignard intermediate or a mixture of regiochemical Grignard intermediates and polymerising said Grignard intermediate in the presence of a suitable catalyst.

The term "catalytic amount" as used above and below refers to an amount of organohalide or organomagnesium halide that is clearly below one equivalent of the other co-reagents like the thiophene monomer, preferably from >0 to 0.5, very preferably from >0 to 0.1, most preferably from >0 to 0.05 equivalents of the thiophene monomer.

The invention further relates to a process as described above and below, wherein the thiophene is a 3-substituted soluble thiophene having groups in 2- and 5-position that are capable of reacting with magnesium.

The invention further relates to a process as described above and below, wherein the polymer is a regioregular head-to-tail (HT) polymer having a regioregularity of ≧90%, preferably ≧95%, very preferably ≧98%.

The invention further relates to a process as described above and below, by
a) providing a suspension of magnesium in an organic solvent, preferably at room temperature or cooled to a temperature below room temperature,
b) adding the thiophene having two groups that are capable of reacting with magnesium, optionally dissolved in a solvent or a mixture of solvents,
c) adding the organohalide or organomagnesium halide in an amount from >0 to 0.5 equivalents of the thiophene, so that said thiophene reacts with the magnesium to form a regiochemical Grignard intermediate or a mixture of regiochemical Grignard intermediates, and optionally adding further of the thiophene or thiophene solution,
d) adding the catalyst, or adding the reaction mixture to the catalyst, and optionally agitating the resulting mixture, to form a polymer, and
e) recovering the polymer from the mixture,
wherein optionally the thiophene and the organohalide or organomagnesium halide are added together to the magnesium, i.e. steps b) and c) are combined, and
wherein optionally step c) is carried out before step b), i.e. the organohalide or organomagnesium halide is added to the magnesium before the thiophene, and
wherein in step d) optionally the reaction mixture is warmed to room temperature or a higher temperature before adding the catalyst.

The invention further relates to novel polymers, in particular novel poly-3-substituted thiophenes, obtainable or obtained by a process as described above and below.

The invention further relates to a semiconductor or charge transport material, component or device comprising one or more polymers as described above and below.

The invention further relates to the use of polymers according to the invention as charge-transport, semiconducting, electrically conducting, photoconducting or light-emifting material in optical, electrooptical or electronic components or devices, organic field effect transistors (OFET), integrated circuitry (IC), thin film transistors (TFT), flat panel displays, radio frequency identification (RFID) tags, electroluminescent or photoluminescent devices or components, organic light emitting diodes (OLED), backlights of displays, photovoltaic or sensor devices, charge injection layers, Schottky diodes, planarising layers, antistatic films, conducting substrates or patterns, electrode materials in batteries, photoconductors, electrophotographic applications, electrophotographic recording, organic memory devices, alignment layers, or for detecting and discriminating DNA sequences.

The invention further relates to an optical, electrooptical or electronic device, FET, integrated circuit (IC), TFT, OLED or alignment layer comprising a semiconducting or charge transport material, component or device according to the invention.

The invention further relates to a TFT or TFT array for flat panel displays, radio frequency identification (RFID) tag, electroluminescent display or backlight comprising a semiconducting or charge transport material, component or device or a FET, IC, TFT or OLED according to the invention.

The invention further relates to a security marking or device comprising a FET or an RFID tag according to the invention.

DETAILED DESCRIPTION OF THE INVENTION

The polymers prepared by the process according to the present invention are preferably selected of formula I

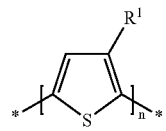

I wherein n is an integer >1 and $R^1$ is a group that does not react with magnesium under the conditions as described for the process according to the present invention above and below. Preferably $R^1$ is an organic group which when it is unsubstituted and unmodified straight chained or branched alkyl has 5 or more C-atoms. Very preferably $R^1$ is an organic group having 5 or more C-atoms.

The thiophene used as educt in the process according to the present invention is preferably selected of formula II

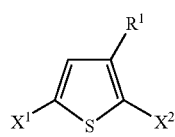

II wherein $R^1$ has the meaning given in formula I and $X^1$ and $X^2$ are independently of each other a group that is capable of reacting with magnesium. Especially preferably $X^1$ and $X^2$ are Cl and/or Br, most preferably Br.

The organohalide or organomagnesium halide used in the process according to the present invention is preferably an alkyl- or arylhalide of formula III

$R^3$—(Mg)—$X^3$          III wherein
$R^3$ is aryl or heteroaryl which is optionally substituted by one or more groups L, or straight chain, branched or cyclic alkyl with 1 to 20 C-atoms, which is optionally mono- or polysubstituted by F, Cl, Br or I, and wherein one or more non-adjacent $CH_2$ groups are optionally replaced, in each case independently from one another, by —O—, —S—, —$NR^0$—, —$SiR^0R^{00}$—, —$CY^1$=$CY^2$— or —C≡C— in such a manner that O and/or S atoms are not linked directly to one another,
L is F, Cl, Br, I or alkyl, alkoxy or thioalkyl with 1 to 20 C atoms, wherein one or more H atoms may be substituted by F or Cl,
$Y^1$ and $Y^2$ are independently of each other H, F or Cl,
$R^0$ and $R^{00}$ are independently of each other H, alkyl with 1 to 12 C-atoms or aryl,
X is Br, Cl or I, preferably Br.

If $R^3$ is aryl or heteroaryl it is preferably selected from phenyl, benzyl, fluorinated phenyl, pyridine, pyrimidine, biphenyl, naphthalene, thiophene, selenophene, fluorinated thiophene, benzo[1,2-b:4,5-b']dithiophene, thiazole and oxazole, all of which are unsubstituted, mono- or polysubstituted with L as defined above.

If $R^3$ is an alkyl group it may be straight-chain or branched. It is preferably straight-chain, has 2, 3, 4, 5, 6, 7 or 8 carbon atoms and accordingly is preferably methyl, ethyl, propyl, butyl, pentyl, hexyl, heptyl, octyl, nonyl, decyl, undecyl, dodecyl, tridecyl, tetradecyl, or pentadecyl, for example.

If $R^3$ is an alkyl group wherein one or more $CH_2$ groups are replaced by —CH=CH—, this may be straight-chain or branched. It is preferably straight-chain, has 2 to 10 C-atoms and accordingly is preferably vinyl, prop-1-, or prop-2-enyl, but-1-, 2- or but-3-enyl, pent-1-, 2-, 3-or pent-4-enyl, hex-1-, 2-, 3-, 4- or hex-5-enyl, hept-1-, 2-, 3-, 4-, 5-or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl.

$R^3$ can also be a chiral group like for example 2-butyl (=1-methylpropyl), 2-methylbutyl, 2-methylpentyl, 3-methylpentyl, 2-ethylhexyl, 2-propylpentyl, 4-methylhexyl, 2-hexyl, 2-octyl, 2-nonyl, 2-decyl, 2-dodecyl, 1,1,1-trifluoro-2-octyl, 1,1,1-trifluoro-2-hexyl or an achiral branched group like for example isopropyl, isobutyl (=methylpropyl) or isopentyl (=3-methylbutyl).

Very preferably $R^3$ is straight-chain or branched alkyl or alkenyl with 1 to 12 C atoms, phenyl or benzyl.

Especially suitable and preferred organohalides are for example methyl bromide, ethyl bromide, isopropyl bromide, vinyl bromide and benzyl bromide.

The organohalide or organomagnesium halide is preferably added in an amount from 0.001 to 0.1, very preferably from 0.01 to 0.05 equivalents of the thiophene monomer.

The process according to the present invention offers significant advantages over the methods disclosed in prior art especially regarding economical and ecological aspects, whilst providing polythiophenes in comparable or even better yield and quality.

With the process according to the present invention it is possible to prepare polythiophenes, in particular HT-poly-(3-substituted) thiophenes with a regioregularity of 90% or higher in a yield of 50% or higher (related to the thiophene educt). As mentioned above, these highly regioregular HT-poly-(3-substituted) thiophenes are particularly suitable for use as charge-transport or semiconductor material in electronic or optical devices.

The regioregular polymers of the present invention thus have a high number, and do preferably exclusively consist, of HT-linked repeating units as shown in formula Ia

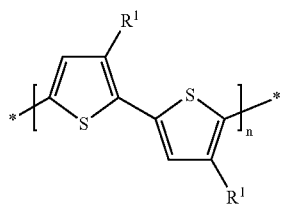

Ia

Furthermore, the process according to the present invention is cost-effective and safe and in particular has the following advantages:

Only a small amount of alkyl halide byproduct is generated. This is advantageous because the alkyl halide byproduct can interfere with the polymerisation causing undesired endcapping and lower molecular weights. Also, the emission of large amounts of hazardous byproducts like methyl bromide can be avoided Magnesium metal can be used directly, rather than air sensitive solutions of preformed alkyl grignards. Moreover, the reaction can also be run in cyclic ethers like THF instead of diethyl ether.

The Grignard reaction can be run at low temperatures. This allows the inclusion of sensitive functionalities onto the thiophene monomer.

After polymerisation the polymer is preferably recovered from the reaction mixture, for example by conventional work-up, and purified. This can be achieved according to standard methods known to the expert and described in the literature.

As a result of the process according to the present invention, the obtained polythiophenes are usually terminated by the leaving groups that are capable of reacting with magnesium in 2 and 5-position of the thiophene monomer, or derivatives thereof. In case thiophene educts of formula II are used, the obtained polymers correspond to formula I1

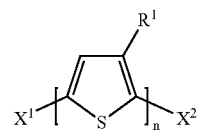

I1 wherein n, $R^1$, $X^1$ and $X^2$ have the meanings given in formula I and II.

In another preferred embodiment of the present invention the terminal groups of the polymer are chemically modified ('endcapped') during or after polymerisation.

Endcapping can be carried out before or after recovering the polymer from the polymerisation reaction mixture, before or after work-up of the polymer or before or after its purification, depending on which is more suitable and more effective regarding the material costs, time and reaction conditions involved. For example, in case expensive co-reactants are used for endcapping it may be more economical to carry out the endcapping after purification of the polymer. In case the purification effort is economically more important than the co-reactants it may be preferred to carry out the endcapping before purification or even before recovering the polymer from the polymerisation reaction mixture.

As a result of the process according to the present invention, at the end of the polymerisation step the end groups $X^1$ and $X^2$ are either a halogen or Grignard group. Also, small amounts of endgroups $R^3$ can be present as a result of a reaction with the byproduct $R^3X^3$ from the preparation of the thiophene intermediate. For endcapping, typically an aliphatic Grignard reagent RMgX or dialkyl Grignard reagent $MgR_2$, wherein X is halogen and R is an aliphatic group, or active magnesium is added to convert the remaining halogen end groups to Grignard groups. Subsequently, for example to give an alkyl end group an excess of an ω-haloalkane is added which will couple to the Grignard. Alternatively, to give a proton end group the polymerisation is quenched into a non-solvent such as an alcohol.

To provide reactive functional end groups, like for example hydroxyl or amine groups or protected versions thereof, the halogen end groups are for example reacted with a Grignard reagent R'MgX, wherein R' is such a reactive functional group or protected reactive functional group.

Instead of a Grignard reagent it is also possible to carry out endcapping using an organo lithium reagent, followed by addition of an ω-haloalkane.

It is also possible to replace H end groups by reactive functional groups by using e.g. the methods described in U.S. Pat. No. 6,602,974, such as a Vilsmeier reaction to introduce aldehyde groups followed by reduction with metal hydrides to form hydroxyl groups.

If the polymer has been fully worked up prior to endcapping, it is preferred to dissolve the polymer in a good solvent for Grignard coupling such as diethyl ether or THF. The solution is then treated for example with the above mentioned organo Grignard reagent RMgX or MgR$_2$ or R'MgX or with a zinc reagent, RZnX, R'ZnX or ZnR$_2$, where R and R' are as defined above. A suitable nickel or palladium catalyst is then added along with the haloalkane.

Very preferred are endcapped polymers wherein the terminal groups during or after polymerisation are replaced by H or an alkyl group (hereinafter also referred to as 'polymers endcapped by H or an alkyl group').

Preferably endcapping is carried out before purification of the polymer. Further preferably endcapping is carried out after step d) of the process as described above and below. In another preferred embodiment of the present invention the endcapper is added during polymerisation to remove the end groups and possibly control the molecular weight of the polymer.

Preferably, substantially all molecules in a polymer sample are endcapped in accordance with this invention, but at least 80%, preferably at least 90%, most preferably at least 98% are endcapped.

By chemical modification of the terminal groups (endcapping) of the polymers according to the present invention, it is possible to prepare novel polymers with different terminal groups. These polymers are preferably selected of formula I2

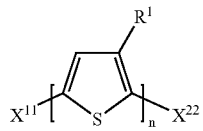

I2 wherein n and R$^1$ have the meanings given in formula I and II, and X$^{11}$ and X$^{22}$ are independently of each other H, halogen, stannate, boronate or an aliphatic, cycloaliphatic or aromatic group that may also comprise one or more hetero atoms.

Especially preferably X$^{11}$ and X$^{22}$ are selected from H or straight-chain or branched alkyl with 1 to 20, preferably 1 to 12, very preferably 1 to 6 C-atoms, most preferably straight-chain alkyl or branched alkyl like isopropyl or tert. butyl. Aromatic groups X$^{11}$ and X$^{22}$ tend to be bulky and are less preferred.

As described above, the end groups X$^{11}$ and X$^{22}$ are preferably introduced by reacting the polymer of formula I1 with a Grignard reagent MgRX, MgR$_2$ or MgR'X as described above, wherein R and R' are X$^{11}$ or X$^{22}$ as defined in formula I2.

By introducing suitable functional end groups X$^{11}$ and/or X$^{22}$ it is possible to prepare block copolymers from the polymers according to the present invention. For example, if one or both of the end groups X$^{11}$ and X$^{22}$ in a polymer of formula I2 is a reactive group or a protected reactive group, like for example an optionally protected hydroxy or amine group, they can be reacted (after removing the protective group) with the end group of another polymer of formula I2 (e.g. with different groups R$^1$ and/or X$^{11}$ and/or X$^{22}$), or with a polymer of different structure. If one of X$^{11}$ and X$^{22}$ is a reactive group, diblock copolymers can be formed. If both X$^{11}$ and X$^{22}$ are reactive groups, a triblock copolymer can be formed.

Alternatively a block copolymer can be formed by introducing reactive or protected reactive groups X$^{11}$ and/or X$^{22}$, adding a catalyst and one or monomers, and initiating a new polymerization reaction starting from the site of the groups X$^{11}$ and/or X$^{22}$.

Suitable functional end groups and methods of their introduction can be taken from the above disclosure and from prior art. Details how to prepare block copolymers can also be taken e.g. from U.S. Pat. No. 6,602,974.

The process according to the present invention is exemplarily illustrated in Scheme I below, wherein n, R$^1$, R$^3$, X$^1$, X$^2$ and X$^3$ have the meaning of formula I, II and III.

Scheme 1

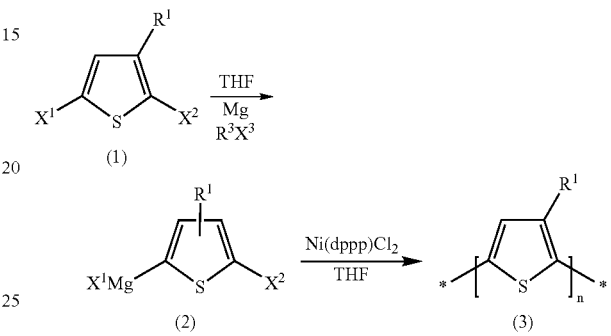

R$^3$X$^3$ is preferably an organohalide like e.g. MeBr, i-PropBr, EtBr added in a catalytic amount, preferably 0.01 to 0.05 equivalents of (1). If R$^1$ is a group that is reactive with magnesium under the process conditions as described above and below, it is preferably transformed into, or coupled with, a protective group, in order not to take part in the reactions forming (2) and (3). Suitable protective groups are known to the expert and described in the literature, for example in Greene and Greene, "Protective Groups in Organic Synthesis", John Wiley and Sons, New York (1981).

The starting materials and reagents used in the process according to the present invention are either commercially available (e.g. from Aldrich) or can be easily synthesized by methods well known to those skilled in the art.

In some cases it may be suitable to further purify the thiophene monomer and the other reagents before using them in the inventive process. Purification can be carried out by standard methods known to the expert and described in the literature.

The process according to the present invention as exemplarily depicted in Scheme 1 is preferably carried out as follows:

In a first step (a) a suspension of magnesium in a solvent like e.g. THF or a solvent mixture is provided, for example at room temperature (RT) or slightly above, preferably cooled to a temperature below RT, very preferably below +5° C., most preferably below 0° C., especially 0 to −5° C. The magnesium is provided in an at least molar amount of the thiophene educt (1), preferably in an excessive amount from more than 1 to 3, preferably from 1.01 to 2.00, very preferably from 1.02 to 1.50, most preferably from 1.02 to 1.20 times the molar amount of the thiophene educt (1).

In a second step (b) a 3-substituted thiophene (1), preferably 3-substituted 2,5-dihalothiophene, most preferably 3-substituted 2,5-dibromothiophene, like for example 2,5-dibromo-3-alkylthiophene, preferably dissolved in a solvent like THF or a solvent mixture, is added to the magnesium suspension while keeping the temperature at or below RT, preferably below +5° C.

The solvent or solvent mixture preferably consists of one or more polar aprotic solvents, which can be any solvent of this type, like for example dialkylethers such as diethyl ether, di-n-butyl ether, di-n-propyl ether, di-isopropyl ether, glycol ethers such as 1,2-dimethoxyethane, ethers with two different alkyl groups such as tert.-butylmethyl ether, cyclic ethers like tetrahydrofuran (THF), 2-methyl tetrahydrofuran, tetrahydropyran or 1,4-dioxan, or mixtures of these colvents, or mixtures of aromatic or aliphatic solvents such as mixtures of toluene with the above ethers.

Preferably the solvent is selected from cyclic ethers, especially preferably from THF or 2-methyltetrahydrofuran.

The concentration of the thiophene educt (1) in the solvent is preferably from 40 to 200 g/l, very preferably from 80 to 130 g/l.

In the next step (step c)), a catalytic amount of an organohalide or organomagnesium halide, preferably or formula ll, which is optionally dissolved in an organic solvent like THF, is added to the reaction mixture, preferably in an amount from 0.01 to 0.05 equivalents of thiophene. This starts the Grignard reaction. The reaction mixture is optionally stirred or otherwise agitated, preferably at a temperature from −5 to +5° C., until all the magnesium is consumed, to give the intermediate (2).

It is also possible to combine steps b) and c) by adding a solution containing both the thiophene and the organohalide or organomagnesium halide to the magnesium suspension, preferably over a longer time interval (e.g. several hours) depending on the total amount of reagents.

It is also possible to carry out step c) before step b), i.e. first adding the organohalide or organomagnesium halide, and then adding the thiophene or thiophene solution.

The total amount of thiophene is approximately 1 equivalent or less of the magnesium. It is possible to add the complete amount of thiophene to the reaction mixture in one portion in step b). In a preferred embodiment, however, only a small portion of the total amount of thiophene or thiophene solution is added to the reaction mixture in step b), preferably in an amount of >0 to 50 mol %, very preferably 1 to 50 mol %, most preferably 5 to 20% of the magnesium. Then the organohalide or organomagnesium halide is added as described in step c) to start the Grignard reaction. The reaction mixture is optionally stirred or otherwise agitated, preferably at a temperature from −5 to +5° C., whilst the remainder of the thiophene or thiophene solution is added. Stirring or agitation is continued, preferably at a temperature from −5 to +5° C. until all the magnesium is consumed, to give the intermediate (2).

In an optional next step the non-reacted magnesium is then removed from the reaction mixture e.g. by filtration. Preferably the magnesium is removed. The solution can be warmed to RT or a temperature above room temperature prior to the magnesium removal.

In the next step (d), the reaction mixture is warmed to RT or a temperature above RT, and a suitable catalyst is added to the reaction mixture in an effective amount to initiate the polymerisation via a Grignard metathesis reaction. Usually the catalyst is reactive enough to start the polymerisation without other means, however in practice the mixture is typically stirred while adding the catalyst. The polymerisation cross-coupling reaction is then allowed to proceed, optionally under agitating and/or heating the reaction mixture, for example heating to reflux, for a sufficient period of time to give the polymer (3).

Alternatively, it is also possible to add the reaction mixture to the catalyst.

The catalyst in step d) can be any catalyst that is suitable for a reaction involving organometallic reagents, including for example Ni, Pd or other transition metal catalysts. Preferably it is selected from nickel catalysts, in particular Ni(II) catalysts like Ni(dppp)Cl$_2$ (1,3-diphenylphosphinopropane nickel(II) chloride) or Ni(dppe)Cl$_2$ (1,2-bis(diphenylphosphino)ethane nickel(II) chloride), furthermore e.g. copper catalysts like CuI, CuBr or Li$_2$CuCl$_4$ or Pd catalysts like Pd(PPh$_3$), PdCl$_2$(dppe), PdCl$_2$(dppf) or iron catalysts like Fe(acac)$_3$.

The catalyst is preferably added in an amount from 0.1 to 5%, preferably 0.5 to 2 mol % of the thiophene educt.

The process according to the present invention may be run at any temperature providing a sufficient conversion rate. It is preferred that the reaction is performed at a temperature between −5° C. and the solvent's reflux temperature, in particular at the temperatures as specified above and below. The term "reflux temperature" includes temperatures at or slightly below the boiling point of the solvent.

The selection of a suitable reaction time depends on the actual rate of the individual reaction. Preferably the reaction times are as given above and below.

For the reaction of the thiophene educt with magnesium (step c)) the reaction temperature is preferably in the range from +5 to −5° C., most preferably from 0 to −5° C. The reaction time is from 15 min to 24 h, preferably from 30 min to 6 h.

For the polymerisation reaction (step d)) the temperature is preferably in the range from −5° C. to reflux temperature, most preferably from room temperature to reflux temperature. The reaction time is from 15 min to 48 h, preferably from 45 min to 4h.

The steps b), c) and d) are optionally carried out under agitating the reaction mixture,which can be achieved by known methods.

Steps a) to d), in particular steps c) and d) are preferably carried out under a dry and inert atmosphere, e.g. under nitrogen.

The reaction products (2) and (3) prepared by the process according to the present invention may be isolated by usual work-up and purification with standard procedures well known to those skilled in the art.

The intermediate (2) obtained in step b) is directly used in step d). However, for the purpose of e.g. investigating the proceeding of the reaction process or analysing the ratio of the regiochemical intermediates produced it may be suitable to quench the reaction mixture.

In the next step (e) the polymer (3) is recovered from the reaction mixture. Preferably the polymer is recovered from the mixture by quenching the reaction mixture with an alcoholic or aqueous solution or/and precipitating the polymer.

The polymer can then be purified by known methods to remove inorganic impurities as well as monomers and short-chain oligomers, or may also be used without further purification. Preferably the polymer is purified. Suitable and preferred purification methods include solid-phase extraction, liquid-liquid extraction, precipitation, adsorption and filtration. Preferably a combination of purification methods is selected to obtain a high-purity product best suitable for application, For example a preferred purification method includes aqueous quenching, for example with a mixture of chloroform/water, optional liquid/liquid extraction or distilling off the original solvent, precipitation into a polar solvent like for example methanol, and washing with an unpolar solvent like for example heptane.

Suitable reagents and process conditions for the steps d) and e) including the reaction of the intermediate (2) to the polymer (3), can also be taken from the literature.

The intermediate (2) is usually obtained as a mixture of regiochemical isomers (2a) and (2b), and may also include a, typically small, amount of the double-Grignard product (2c), as shown below, wherein $X^1$, $X^2$ and $R^1$ have the meanings of formula I and I1

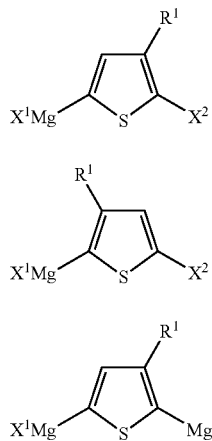

The ratio of these intermediates is depending for example on the molar excess of Magnesium, the solvent, temperature and reaction time.

For example, if the reaction is carried out according to the especially preferred embodiment described above, the intermediates 2a, 2b and 2c can be obtained in a ratio of 85/5/10.

Depending on the processing conditions, like for example the solvent and the amount of magnesium, the ratio of isomer intermediates 2a/2b/2c can be varied. A preferred process includes isomer intermediate ratios 2a/2b/2c of 80-90/2-20/0-20.

The polymers according to the present invention are especially preferably regioregular HT-poly-(3-substituted) thiophenes. The regioregularity (=head-to-tail couplings divided by the total couplings, and expressed as a percentage), in these polymers is preferably at least 85%, in particular 90% or more, very preferably 95% or more, most preferably from 98 to 100%.

Polymers of formula I, I1 and I2 having a high percentage of HT-couplings accordingly have a corresponding high number of HT dyads or HT-HT-triads formula Ia/b, I1a/b and I2a/b shown below.

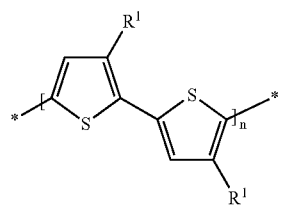

wherein $R^1$, $X^1$, $X^2$, $X^{11}$, $X^{22}$ have the meanings given above.

Regioregular poly-(3-substituted) thiophenes are advantageous as they show strong interchain pi-pi-stacking interactions and a high degree of crystallinity, making them effective charge transport materials with high carrier mobilities.

The polymers according to the present invention preferably have a degree of polymerisation (or number n of recurring units) from 2 to 5,000, in particular from 10 to 5,000 or from 110 to 5,000, very preferably from 50 to 1,000, most preferably from above 100 to 1,000.

Further preferred are polymers having a molecular weight from 5,000 to 300,000, in particular from 10,000 to 100,000, preferably from 15,000 to 100,000, very preferably from 20,000 to 100,000.

$R^1$ in formula I, I1 and II is preferably an organic group, preferably a non-reactive or protected reactive organic group, which has preferably 5 or more C-atoms.

Especially preferably $R^1$ is straight chain, branched or cyclic alkyl with 1 or more, preferably 5 or more, very preferably 1 to 20 C-atoms, which may be unsubstituted, mono- or poly-substituted by F, Cl, Br or I, wherein one or more non-adjacent CH$_2$ groups are optionally replaced, in each case independently from one another, by —O—, —S—, —NR$^0$—, —SiR$^0$R$^{00}$—, —CY$^1$=CY$^2$— or —C≡C— in such a manner that O and/or S atoms are not linked directly to one another, optionally substituted aryl or heteroaryl preferably having 1 to 30 C-atoms, or P-Sp, with R$^0$ and R$^{00}$ being independently of each other H or alkyl with 1 to 12 C-atoms, Y$^1$ and Y$^2$ being independently of each other H, F or Cl, P being a polymerisable or reactive group which is optionally protected, and Sp being a spacer group or a single bond.

X$^1$ and X$^2$ in formula I1 and II are preferably independently of each other selected from halogen, very preferably Cl or Br, most preferably Br.

X$^{11}$ and X$^{22}$ in formula I2 are preferably independently of each other selected from H, halogen, B(OR')(OR") or SnR$^0$R$^{00}$R$^{000}$ or straight chain, branched or cyclic alkyl with 1 to 20 C-atoms, which may be unsubstituted, mono- or poly-substituted by F, Cl, Br, I, —CN and/ or —OH, it being also possible for one or more non-adjacent CH$_2$ groups to be replaced, in each case independently from one another, by —O—, —S—, —NH—, —NR$^0$—, —SiR$^0$R$^{00}$—, —CO—, —COO—, —OCO—, —OCO—O—, —S—CO—, —CO—S—, —CY$^1$=CY2— or —C≡C— in such a manner that O and/or S atoms are not linked directly to one another, optionally substituted aryl or heteroaryl, or P-Sp, with R$^0$, R$^{00}$, Y$^1$, Y$^2$, P and Sp having the meanings given above, R$^{000}$ being H or alkyl with 1 to 12 C-atoms, and R' and R" being independently of each other H or alkyl with 1 to 12 C-atoms, or OR' and OR" together with the boron atom may also form a cyclic group having 2 to 10 C atoms.

Especially preferred are polymers and compounds of formula I, II, I1 and I2 wherein R$^1$ is an organic group, preferably an alkyl group with 5 or more C-atoms, R$^1$ is a straight-chain alkyl group with 1 to 12, preferably 5 to 12 C-atoms, R$^1$ is n-hexyl, R$^1$ is selected from C$_1$-C$_{20}$-alkyl that is optionally substituted with one or more fluorine atoms, C$_1$-C$_{20}$-alkenyl, C$_1$-C$_{20}$-alkynyl, C$_1$-C$_{20}$-alkoxy, C$_1$-C$_{20}$-thioalkyl, C$_1$-C$_{20}$-silyl, C$_1$-C$_{20}$-amino, C$_1$—C20-fluoroalkyl, optionally substituted aryl or heteroaryl, or P-Sp-, in particular C$_1$-C$_{20}$-alkyl or C$_1$-C$_{20}$-fluoroalkyl, preferably straight-chain groups, R$^1$ is selected from alkyl that is optionally substituted with one or more fluorine atoms, alkenyl, alkynyl, alkoxy, thioalkyl or fluoroalkyl, all of which are straight-chain and have 1 to 12, preferably 5 to 12 C-atoms, R$^1$ is selected from pentyl, hexyl, heptyl, octyl, nonyl, decyl, undecyl or dodecyl, X$^1$ and X$^2$ have the same meaning, X$^1$ and X$^2$ denote Br, X$^{11}$ and X$^{22}$ have the same meaning, X$^{11}$ and X$^{22}$ denote H, X$^{11}$ and X$^{22}$ are selected from alkyl that is optionally substituted with one or more fluorine atoms, alkenyl, alkynyl, alkoxy, thioalkyl, silyl, ester, amino or fluoroalkyl, all of these groups being straight-chain or branched and having 1 to 20, preferably 1 to 12, most preferably 1 to 6 C atoms, or optionally substituted aryl or heteroaryl, or P-Sp as defined above, in particular straight-chain or branched C$_1$-C$_6$-alkyl, most preferably isopropyl, tert-.butyl, or 2-methylbutyl, n is an integer from 2 to 5000, in particular 50 to 1000.

If in formula I, II, I1 and I2 R$^1$ is an alkyl or alkoxy radical, i.e. where the terminal CH$_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If in formula I, II, I1 and I2 R$^1$ is oxaalkyl, i.e. where one CH$_2$ group is replaced by —O—, is preferably straight-chain 2-oxapropyl (=methoxymethyl), 2- (=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-,7-, 8- or 9-oxadecyl, for example.

If in formula I, II and I1 R$^1$ is thioalkyl, i.e where one CH$_2$ group is replaced by —S—, is preferably straight-chain thiomethyl (=—SCH$_3$), 1-thioethyl (—SCH$_2$CH$_3$), 1-thiopropyl (=—SCH$_2$CH$_2$CH$_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the CH$_2$ group adjacent to the SP$^2$ hybridised vinyl carbon atom is replaced.

If in formula I, II, I1 and I2 R$^1$ is fluoroalkyl, it is preferably straight-chain perfluoroalkyl C$_i$F$_{2i+1}$, wherein i is an integer from 1 to 15, in particular CF$_3$, C$_2$F$_5$, C$_3$F$_7$, C$_4$F$_9$, C$_5$F$_{11}$, C$_6$F$_{13}$, C$_7$F$_{15}$ or C$_8$F$_{17}$, very preferably C$_6$F$_{13}$.

—CY$^1$=CY$^2$— is preferably —CH=CH—, —CF=CF— or —CH=C(CN)—.

Aryl and heteroaryl preferably denote a mono-, bi- or tricyclic aromatic or heteroaromatic group with up to 25 C atoms that may also comprise condensed rings and is optionally substituted with one or more groups L, wherein L is halogen or an alkyl, alkoxy, alkylcarbonyl or alkoxycarbonyl group with 1 to 12 C atoms, wherein one or more H atoms may be replaced by F or Cl.

Especially preferred aryl and heteroaryl groups are phenyl in which, in addition, one or more CH groups may be replaced by N, naphthalene, thiophene, thienothiophene, dithienothiophene, alkyl fluorene and oxazole, all of which can be unsubstituted, mono- or polysubstituted with L as defined above.

Another preferred embodiment of the present invention relates to polythiophenes that are substituted in 3-position with a polymerisable or reactive group, which is optionally protected during the process of forming the polythiophene. Particular preferred polymers of this type are those of formula I, I1 or I2 wherein R$^1$ denotes P-Sp. These polymers are particularly useful as semiconductors or charge transport materials, as they can be crosslinked via the groups P, for example by polymerisation in situ, during or after processing the polymer into a thin film for a semiconductor component, to yield crosslinked polymer films with high charge carrier mobility and high thermal, mechanical and chemical stability.

Preferably the polymerisable or reactive group P is selected from CH$_2$=CW$^1$—COO—, CH$_2$=CW$^1$—CO—,

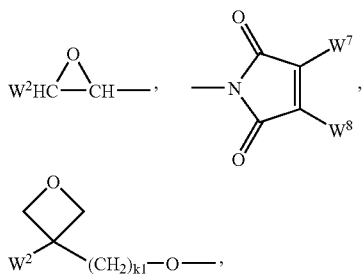

$CH_2=CW^2-(O)_{k1}-$, $CH_3-CH=CH-O-$, $(CH_2=CH)_2CH-OCO-$, $(CH_2=CH-CH_2)_2CH-OCO-$, $(CH_2=CH)_2CH-O-$, $(CH_2=CH-CH_2)_2N-$, $(CH_2=CH-CH_2)_2N-CO-$, $HO-CW^2W^3-$, $HS-CW^2W^3-$, $HW^2N-$, $HO-CW^2W^3-NH-$, $CH_2=CW^1-CO-NH-$, $CH_2=CH-(COO)_{k1}\text{-Phe-}(O)_{k2}-$, $CH_2=CH-(CO)_{k1}\text{-Phe-}(O)k_2-$, $\text{Phe-}CH=CH-$, $HOOC-$, $OCN-$, and $W^4W^5W^6Si-$, with $W^1$ being H, Cl, CN, $CF_3$, phenyl or alkyl with 1 to 5 C-atoms, in particular H, Cl or $CH_3$, $W^2$ and $W^3$ being independently of each other H or alkyl with 1 to 5 C-atoms, in particular H, methyl, ethyl or n-propyl, $W^4$, $W^5$ and $W^6$ being independently of each other Cl, oxaalkyl or oxacarbonylalkyl with 1 to 5 C-atoms, $W^7$ and $W^8$ being independently of each other H, Cl or alkyl with 1 to 5 C-atoms, Phe being 1,4-phenylene that is optionally substituted by one or more groups L as defined above, and $k_1$ and $k_2$ being independently of each other 0 or 1, or a protected derivative of these groups which is non-reactive with magnesium under the conditions described for the process according to the present invention. Suitable protective groups are known to the expert and described in the literature, for example in Greene and Greene, "Protective Groups in Organic Synthesis", John Wiley and Sons, New York (1981), like for example acetals or ketals.

Preferably, however, the polymerisable group is added to the inventive polymers as the last step, after polymerisation.

Especially preferred groups P are $CH_2=CH-COO-$, $CH_2=C(CH_3)-COO-$, $CH_2=CH-$, $CH_2=CH-O-$, $(CH_2=CH)_2CH-OCO-$, $(CH_2=CH)_2CH-O-$,

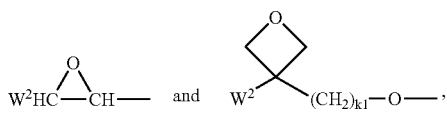

or protected derivatives thereof.

Polymerisation of group P can be carried out according to methods that are known the expert and described in the literature, for example in D. J. Broer; G. Challa; G. N. Mol, *Macromol. Chem*, 1991, 192, 59.

As spacer group Sp all groups can be used that are known for this purpose to the skilled in the art. The spacer group Sp is preferably of formula Sp'-X', such that P-Sp- is P-Sp'-X'-, wherein Sp' is alkylene with up to 30 C atoms which is unsubstituted or mono- or polysubstituted by F, Cl, Br, I or CN, it being also possible for one or more non-adjacent $CH_2$ groups to be replaced, in each case independently from one another, by $-O-$, $-S-$, $-NH-$, $-NR^0-$, $-SiR^0R^{00}-$, $-CO-$, $-COO-$, $-OCO-$, $-OCO-O-$, $-S-CO-$, $-CO-S-$, $-CH=CH-$ or $-C\equiv C-$ in such a manner that O and/or S atoms are not linked directly to one another, X' is $-O-$, $-S-$, $-CO-$, $-COO-$, $-OCO-$, $-O-COO-$, $-CO-NR^0-$, $-NR^0-CO-$, $-NR^0-CO-NR^{00}-$, $-OCH_2-$, $-CH_2O-$, $-SCH_2-$, $-CH_2S-$, $-CF_2O-$, $-OCF_2-$, $-CF_2S-$, $-SCF_2-$, $-CF_2CH_2-$, $-CH_2CF_2-$, $-CF_2CF_2-$, $-CH=N-$, $-N=CH-$, $-N=N-$, $-CH=CR^0-$, $-CY^1=CY^2-$, $-C\equiv C-$, $-CH=CH-COO-$, $-OCO-CH=CH-$ or a single bond, $R^0$ and $R^{00}$ are independently of each other H or alkyl with 1 to 12 C-atoms, and $Y^1$ and $Y^2$ are independently of each other H, F, Cl or CN.

X' is preferably $-O-$, $-S-$, $-OCH_2-$, $-CH_2O-$, $-SCH_2-$, $-CH_2S-$, $-CF_2O-$, $-OCF_2-$, $-CF_2S-$, $-SCF_2-$, $-CH_2CH_2-$, $-CF_2CH_2-$, $-CH_2CF_2-$, $-CF_2CF_2-$, $-CH=N-$, $-N=CH-$, $-N=N-$, $-CH=CR^0O-$, $-CY^1=Cy^2-$, $-C\equiv C-$ or a single bond, in particular $-O-$, $-S-$, $-C\equiv C-$, $-CY^1=CY^2-$ or a single bond. In another preferred embodiment X' is a group that is able to form a conjugated system, such as $-C\equiv C-$ or $-CY^1=CY^2-$, or a single bond.

Typical groups Sp' are, for example, $-(CH_2)_p-$, $-(CH_2CH_2O)_q-CH_2CH_2-$, $-CH_2CH_2-S-CH_2CH_2-$ or $-CH_2CH_2-NH-CH_2CH_2-$ or $-(SiR^0OR^{00}-O)_p-$, with p being an integer from 2 to 12, q being an integer from 1 to 3 and $R^0$ and $R^{00}$ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

The polymers of the present invention are useful as optical, electronic and semiconductor materials, in particular as charge transport materials in field effect transistors (FETs), e.g., as components of integrated circuitry, ID tags or TFT applications. Alternatively, they may be used in organic light emitting diodes (OLEDs) in electroluminescent display applications or as backlight of, e.g., liquid crystal displays, as photovoltaics or sensor materials, for electrophotographic recording, and for other semiconductor applications.

The polymers according to the present invention show especially advantageous solubility properties which allow production processes using solutions of these compounds. Thus films, including layers and coatings, may be generated by low cost production techniques, e.g., spin coating. Suitable solvents or solvent mixtures comprise alkanes and/or aromatics, especially their fluorinated or chlorinated derivatives.

The polymers of the present invention are especially useful as charge transport materials in FETs. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804, and from the references cited in the background and prior art chapter and listed below. Due to the advantages, like low cost production using the solubility properties of the compounds according to the invention and thus the processibility of large surfaces, preferred applications of these FETs are such as integrated circuitry, TFT-displays and security applications.

In security applications, field effect transistors and other devices with semiconductive materials, like transistors or diodes, may be used for ID tags or security markings to authenticate and prevent counterfeiting of documents of value like banknotes, credit cards or ID cards, national ID documents, licenses or any product with money value, like stamps, tickets, shares, cheques etc.

Alternatively, the polymers according to the invention may be used in organic light emitting devices or diodes (OLEDs), e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the polymers according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111-112, 2000, 31-34, Alcala, J. Appl. Phys., 88, 2000, 7124-7128 and the literature cited therein.

According to another use, the polymers according to the present invention, especially those which show photoluminescent properties, may be employed as materials of light sources, e.g., of display devices such as described in EP 0 889 350 A1 or by C. Weder et al., Science, 279, 1998, 835-837.

A further aspect of the invention relates to both the oxidised and reduced form of the polymers according to this invention. Either loss or gain of electrons results in formation of a highly delocalised ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantantion of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, $La(NO_3)_3$ $6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the polymers of the present invention can be used as an organic "metal" in applications, for example, but not limited to, charge injection layers and ITO planarising layers in organic light emitting diode applications, films for flat panel displays and touch screens, antistatic films, printed conductive substrates, patterns or tracts in electronic applications such as printed circuit boards and condensers.

According to another use the polymers according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, Proc. Natl. Acad. Sci. U.S.A. 1999, 96, 12287; D. Wang, X. Gong, P. S. Heeger, F. Rininsland, G. C. Bazan and A. J. Heeger, Proc. Natl. Acad. Sci. U.S.A. 2002, 99, 49; N. DiCesare, M. R. Pinot, K. S. Schanze and J. R. Lakowicz, Langmuir 2002, 18, 7785; D. T. McQuade, A. E. Pullen, T. M. Swager, Chem. Rev. 2000, 100, 2537.

In the foregoing and the following, all temperatures are given in degrees Celsius, and all percentages are by weight, unless stated otherwise. "Room temperature" means 18-20° C.

The examples below serve to illustrate the invention without limiting it. Therein, $^1H$- and $^{13}C$—NMR spectra are recorded on a Bruker AV-300 (300 MHz), using the residual solvent resonance of $CDCl_3$ as an internal reference and are given in ppm. Mass spectra are obtained from an Agilent GCMS using a 6890 series GC with a 5973 MSD (EI). Molecular weight determinations are carried out in chlorobenzene solution on an Agilent 1100 series HPLC using two Polymer Laboratories mixed B columns in series, and the system is calibrated against narrow weight PL polystyrene calibration standards.

EXAMPLE 1

To a dry 3-necked flask under nitrogen is added magnesium filings (354 mg, 14.6 mmol). A solution of 2,5-dibromo-3-hexylthiophene (4.41 g, 13.5 mmol) in anhydrous THF (45 ml) is prepared and 5 ml of this solution is added to the magnesium at 5° C. The reaction is initated by the addition of 2-bromopropane (80 mg, 0.65 mmol). After 5 min, the remaining solution of 2,5-dibromothiophene is added dropwise, keeping the temperature below 10° C. The resulting yellow solution is warmed to room temperature and stirred for 4 h at that temperature. An aliquot is taken, hydrolysed with dilute hydrochloric acid and analysed by GCMS to reveal 98% formation of monogrignard reagent and 2% formation of a digrignard reagent. No starting material remained. The solution is transferred, via cannula, to a new reaction vessel and heated to reflux. 1,2-bis{diphenylphosphinopropane) dichloronickel (II) (72 mg, 1 mol %) is added as a solid and the reaction refluxed for 4 h. The reaction is cooled to room temperature and precipitated into methanol. The resulting polymer is filtered, and washed with additional methanol (soxhlet) and heptane (soxhlet). The resulting polymer is dissolved in chloroform and precipitated into methanol to afford 0.6 g of polymer.

GPC (chlorobenzene): Mn=10,000; Mw=15,000.
¹H—NMR affords a regioregularity of 96%.

EXAMPLE 2

The reaction is repeated as above using 0.5% of bis{diphenylphosphinopropane)dichloronickel (II) to afford 0.86 g of polymer.
GPC (chlorobenzene): Mn=12,000; Mw=22,000.
¹H—NMR affords a regioregularity of 95%.

The invention claimed is:

1. A process for preparing a polymer from an optionally substituted thiophene having at least two groups that are capable of reacting with magnesium, comprising reacting said thiophene with magnesium in the presence of a catalytic amount of an other organohalide or organomagnesium halide to form a regiochemical Grignard intermediate or a mixture of regiochemical Grignard intermediates, and polymerizing said Grignard intermediate or intermediates in the presence of a suitable catalyst, wherein
the thiophene has chloro groups in 2- and 5-position or bromo groups in 2- and 5-position.

2. A process for preparing a regioregular poly(3-substituted thiophene) with a regioregularity of ≧95% head-to-tail (HT) couplings, comprising reacting a 3-substituted thiophene, having chloro and/or bromo groups in 2- and 5-position, with magnesium in the presence of a catalytic amount of an other organohalide or organomagnesium halide in a solvent, or a mixture of solvents, to form a regiochemical Grignard intermediate, or a mixture of regiochemical Grignard intermediates, and polymerising said Grignard intermediate or intermediates in the presence of a suitable catalyst, wherein
the thiophene has chloro groups in 2- and 5-position or bromo groups in 2- and 5-position.

3. A process for preparing a polymer from an optionally substituted thiophene having at least two groups that are capable of reacting with magnesium, comprising reacting said thiophene with magnesium in the presence of a catalytic amount of an organohalide or organomagnesium halide to form a regiochemical Grignard intermediate or a mixture of regiochemical Grignard intermediates, and polymerizing said Grignard intermediate or intermediates in the presence of a suitable catalyst, by
 a) providing a suspension of magnesium in an organic solvent,
 b) adding the thiophene having two groups that are capable of reacting with magnesium, optionally dissolved in a solvent or a mixture of solvents,
 c) adding the organohalide or organomagnesium halide in an amount from >0 to 0.5 equivalents of the thiophene, so that the thiophene reacts with the magnesium to form a regiochemical Grignard intermediate or a mixture of regiochemical Grignard intermediates, and optionally adding further of the thiophene or thiophene solution,
 d) adding the catalyst, or adding the reaction mixture to the catalyst, and optionally agitating the resulting mixture, to form a polymer, and
 e) recovering the polymer from the mixture,
wherein optionally steps b) and c) are combined by adding the thiophene and the organohalide or organomagnesium halide together to the magnesium, wherein optionally step c) is carried out before step b) by adding the organohalide or organomagnesium halide to the magnesium before the thiophene, and wherein
the thiophene has chloro groups in 2- and 5-position or bromo groups in 2- and 5-position.

4. A process according to claim 1, wherein the 3-substituted thiophene is a 3-substituted 2,5-dibromo-thiophene.

5. A process according to claim 1, wherein the poly (3-substituted thiophene) has a regioregularity of ≧98%.

6. A process according to claim 1, wherein the solvent is THF.

7. A process according to claim 1, wherein the amount of the magnesium is from 1.02 to 1.20 times the molar amount of the thiophene educt.

8. A process according to claim 1, wherein unreacted magnesium is removed from the reaction mixture before adding the catalyst.

9. A process according to claim 1, wherein the catalyst is a Ni(II) catalyst.

10. A process according to claim 1, wherein the catalyst is Ni(dppp)Cl₂ (1,3-diphenylphosphinopropane nickel(II) chloride) or Ni(dppe)Cl₂ (1,2-bis(diphenylphosphino) ethane nickel(II) chloride).

11. A process according to claim 1, wherein the formation of the regiochemical Grignard intermediate is carried out at a temperature from +5 to −5° C.

12. A process according to claim 1, wherein the polymerization is carried out at a temperature from room temperature to reflux temperature.

13. A process according to claim 1, wherein the polymer is purified after being recovered from the reaction mixture.

14. A process according to claim 1, wherein the polymer is of formula I

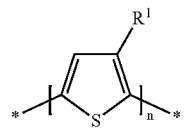

wherein n is an integer >1, $R^1$ is a group that does not react with magnesium under the conditions of the process, and * identifies the location of bonding to an adjacent group in the polymer.

15. A process according to claim 1, wherein the 3-substituted thiophene is of formula II

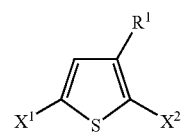

wherein $R^1$ is a group that does not react with magnesium under the conditions of the process, and $X^1$ and $X^2$ are independently of each other Br or Cl.

16. A process according to claim 14, wherein $R^1$ is $C_1$-$C_{20}$-alkyl that is optionally substituted with one or more fluorine atoms, $C_1$-$C_{20}$-alkenyl, $C_1$-$C_{20}$-alkynyl, koxy, $C_1$-$C_{20}$-thioalkyl, $C_1$-$C_{20}$-silyl, $C_1$-$C_{20}$-amino, or $C_1$-$C_{20}$-fluoroalkyl.

17. A process according to claim 16, wherein $R^1$ is straight-chain or branched pentyl, hexyl, heptyl, octyl, nonyl, decyl, undecyl or dodecyl.

18. A process according to claim 15, wherein $X^1$ and $X^2$ are Br.

19. A process according to claim 14, wherein n is an integer from 50 to 1,000.

20. A process according to claim 1, wherein the polymer is of formula II $$\text{II}$$

wherein n is an integer >1, $R^1$ is a group that does not react with magnesium under the conditions of the process, $R^1$, $X^1$ and $X^2$ are independently of each other Br or Cl.

21. A process according to claim 1, wherein the organohalide or organomagnesium halide is of formula III $$R^3\text{—(Mg)—}X^3 \qquad \text{III}$$

wherein
$R^3$ is aryl or heteroaryl which is optionally substituted by one or more groups L, or straight chain, branched or cyclic alkyl with 1 to 20 C-atoms, which is optionally mono- or polysubstituted by F, Cl, Br or I, and wherein one or more non-adjacent $CH_2$ groups are optionally replaced, in each case independently from one another, by —O—, —S—, —$NR^0$—, —$SiR^0R^{00}$—, —$CY^1$=$CY^2$- or —C≡C— in such a manner that O and/or S atoms are not linked directly to one another,
L is F, Cl, Br, I, or alkyl, alkoxy or thioalkyl with 1 to 20 C atoms, wherein one or more H atoms may be substituted by F or Cl,
$Y^1$ and $Y^2$ are independently of each other H, F or Cl,
$R^0$ and $R^{00}$ are independently of each other H, alkyl with 1 to 12 C-atoms or aryl, and
$X^3$ is Br, Cl or I.

22. A process for preparing a polymer from an optionally substituted thiophene having at least two groups that are capable of reacting with magnesium, comprising reacting said thiophene with magnesium in the presence of a catalytic amount of an organohalide or organomagnesium halide to form a regiochemical Grignard intermediate or a mixture of regiochemical Grignard intermediates, and polymerizing said Grignard intermediate or intermediates in the presence of a suitable catalyst, wherein the organohalide or organomagnesium halide is of formula III $$R^3\text{—(Mg)—}X^3 \qquad \text{III}$$

wherein
$R^3$ is straight-chain or branched alkyl or alkenyl with 1 to 12 C atoms, phenyl or benzyl,
L is F, Cl, Br, I, or alkyl, alkoxy or thioalkyl with 1 to 20 C atoms, wherein one or more H atoms may be substituted by F or Cl,
$Y^1$ and $Y^2$ are independently of each other H, F or Cl,
$R^0$ and $R^{00}$ are independently of each other H, alkyl with 1 to 12 C-atoms or aryl, and
$X^3$ is Cl or Br,
wherein
the thiophene has chloro groups in 2- and 5-position or bromo groups in 2- and 5-position.

23. A process according to claim 1, wherein one or more of the terminal groups of the polymer are chemically modified ('endcapped').

24. A process according to claim 23, wherein the polymer after endcapping is of formula 12

$$\text{I2}$$

wherein
n is an integer >1,
$R^1$ is a group that does not react with magnesium under the conditions of the process,
$X^{11}$ and $X^{22}$ are independently of each other H, halogen, $Sn(R^0)_3$ or straight chain, branched or cyclic alkyl with 1 to 20 C-atoms, which may be unsubstituted, mono- or poly-substituted by F, Cl, Br, I, —CN and/ or —OH, it being also possible for one or more non-adjacent $CH_2$ groups to be replaced, in each case independently from one another, by —O—, —S—, —NH—, —$NR^0$—, —$SiR^0R^{00}$—, —CO—, —COO—, —OCO—, —OCO—O—, —S—CO—, —CO—S—, —$CY^1$=$CY^2$- or —C≡C— in such a manner that O and/or S atoms are not linked directly to one another, optionally substituted aryl or heteroaryl, or P-Sp,
P is a polymerizable or reactive group which is optionally protected,
Sp is a spacer group or a single bond,
$R^0$ and $R^{00}$ are independently of each other H or alkyl with 1 to 12 C-atoms, and
$Y^1$ and $Y^2$ are independently of each other H, F, Cl or CN.

25. A process according to claim 24, wherein $X^{11}$ and $X^{22}$ are independently of each other alkyl that is optionally substituted with one or more fluorine atoms, alkenyl, alkynyl, alkoxy, thioalkyl, silyl, ester, amino or fluoroalkyl, all of these groups being straight-chain or branched and having 1 to 20 C atoms, or optionally substituted aryl or heteroaryl, or P-Sp.

26. A process according to claim 24, wherein $X^{11}$ and $X^{22}$ denote straight-chain or branched alkyl with 1 to 6 C atoms.

27. A process according to claim 24, wherein one or both of $X^{11}$ and $X^{22}$ denote a reactive group or a protected reactive group.

28. A process according to claim 24, wherein the polymer of formula 12 is further reacted via end group $X^{11}$ and/or $X^{22}$ with the same or a different polymer of formula I2, or with another polymer, to form a block copolymer.

29. A polymer or copolymer obtained by a process according to claim 1.

30. A charge-transport, semiconducting, electrically conducting, photoconducting or light-emitting material in optical, electrooptical or electronic component or device, organic field effect transistor (OFET), integrated circuitry (IC), thin film transistor (TFT), flat panel display, radio frequency identification (RFID) tag, electroluminescent or photoluminescent component or device, organic light emitting diode (OLED), backlight of a display, photovoltaic or sensor device, charge injection layer, Schottky diode, planarising layer, antistatic film, conducting substrate or pattern, electrode material in a battery, photoconductor, electrophotographic application, electrophotographic recording, organic memory device, alignment layer, or apparatus for detecting or discriminating a DNA sequence, comprising a polymer according to claim 27.

31. A semiconductor or charge transport material, component or device comprising one or more polymers according to claim 27.

32. An optical, electrooptical or electronic device, FET, integrated circuit (IC), TFT, OLED or alignment layer comprising a polymer according to claim 27.

33. A TFT or TFT array for flat panel display, radio frequency identification (RFID) tag, electroluminescent display or backlight, comprising a polymer according to claim 27.

34. A security marking or device, comprising a FET or an RFID tag comprising a polymer according to claim 27.

35. A polymer according to claim 27, which is oxidatively or reductively doped to form conducting ionic species.

36. A charge injection layer, planarizing layer, antistatic film or conducting substrate or pattern for an electronic application or flat panel display, comprising a polymer according to claim 27.

37. A process according to claim 1, comprising
   a) providing a suspension of magnesium in an organic solvent,
   b) adding the thiophene having two groups that are capable of reacting with magnesium, optionally dissolved in a solvent or a mixture of solvents,
   c) adding the organohalide or organomagnesium halide in an amount from >0 to 0.5 equivalents of the thiophene, so that the thiophene reacts with the magnesium to form a regiochemical Grignard intermediate or a mixture of regiochemical Grignard intermediates, and optionally adding further of the thiophene or thiophene solution,
   d) adding the catalyst, or adding the reaction mixture to the catalyst, and optionally agitating the resulting mixture, to form a polymer, and
   e) recovering the polymer from the mixture,
wherein optionally steps b) and c) are combined by adding the thiophene and the organohalide or organomagnesium halide together to the magnesium, and wherein optionally step c) is carried out before step b) by adding the organohalide or organomagnesium halide to the magnesium before the thiophene.

38. A process according to claim 1, wherein the thiophene is reacted with a catalytic amount of an other organohalide.

39. A process according to claim 2, wherein the thiophene is reacted with a catalytic amount of an other organohalide.

40. A process according to claim 3, wherein the thiophene is reacted with a catalytic amount of an other organohalide.

41. A process according to claim 22, wherein the thiophene is reacted with a catalytic amount of an other organohalide.

* * * * *

UNITED STATES PATENT AND TRADEMARK OFFICE
CERTIFICATE OF CORRECTION

PATENT NO. : 7,807,776 B2
APPLICATION NO. : 11/816047
DATED : October 5, 2010
INVENTOR(S) : Heeney et al.

Page 1 of 1

It is certified that error appears in the above-identified patent and that said Letters Patent is hereby corrected as shown below:

Column 22, line 59 reads "atoms, $C_1$-$C_{20}$-alkenyl, $C_1$-$C_{20}$-alkynyl, koxy, $C_1$-$C_{20}$-thio-" should read -- atoms, $C_1$-$C_{20}$-alkenyl, $C_1$-$C_{20}$-alkynyl, $C_1$-$C_{20}$ alkoxy, $C_1$-$C_{20}$-thio- --

Signed and Sealed this
Eighth Day of February, 2011

David J. Kappos
*Director of the United States Patent and Trademark Office*